United States Patent [19]

Rieger

[11] Patent Number: 5,731,718
[45] Date of Patent: Mar. 24, 1998

[54] EVALUATION AND AMPLIFIER CIRCUIT

[75] Inventor: Johann Rieger, Zell, Germany

[73] Assignee: Siemens Aktiengesellschaft, Munich, Germany

[21] Appl. No.: 723,847

[22] Filed: Sep. 30, 1996

[30] Foreign Application Priority Data

Sep. 29, 1995 [DE] Germany .................. 195 36 486.4

[51] Int. Cl.$^6$ ...................................................... G01C 7/00
[52] U.S. Cl. ................................. 327/51; 327/57; 327/55
[58] Field of Search ........................ 327/51, 57, 52–56; 365/205

[56] References Cited

U.S. PATENT DOCUMENTS

| | | | |
|---|---|---|---|
| 4,810,910 | 3/1989 | Schoellikopf et al. | 327/51 |
| 4,904,888 | 2/1990 | Yamauchi et al. | 327/51 |
| 5,030,859 | 7/1991 | Ihara | 327/57 |
| 5,323,345 | 6/1994 | Ohsawa | 327/51 |
| 5,416,371 | 5/1995 | Katayama et al. | 327/57 |
| 5,491,435 | 2/1996 | Mun et al. | 327/57 |
| 5,638,333 | 6/1997 | Lee | 327/57 |

FOREIGN PATENT DOCUMENTS 0 499 460 A2  8/1992  European Pat. Off. ......... G11C 7/06
0 604 195 A2  6/1994  European Pat. Off. ......... G11C 7/06

OTHER PUBLICATIONS

"Microelectronic Circuits" (Sedra et al.), Saunders College Publishing, 3$^{rd}$ edition, pp. 1–6.

*Primary Examiner*—Toan Tran
*Attorney, Agent, or Firm*—Herbert L. Lerner; Laurence A. Greenberg

[57] ABSTRACT

An evaluation and amplifier circuit of the type of a keyed flipflop including at least two first transistors of a given channel type connected in series to each other disposed between first and second signal lines, has a connection from the gates of the first transistors to a respective one of the second and first signal lines. The first two transistors respectively form a first node common to the first two transistors for receiving a first control signal. A series circuit has at least two second transistors of the same channel type as the first transistors being connected in parallel to the first transistors. The gates of the first transistors are further connected with a respective one of the second and first signal lines. Furthermore, the amplifier circuit includes the feature that the second transistors form a second node common to the second transistors for receiving a second control signal, and a differential signal appearing on the signal lines is evaluated and amplified by the second transistors after the first transistors have received the differential signal.

10 Claims, 3 Drawing Sheets

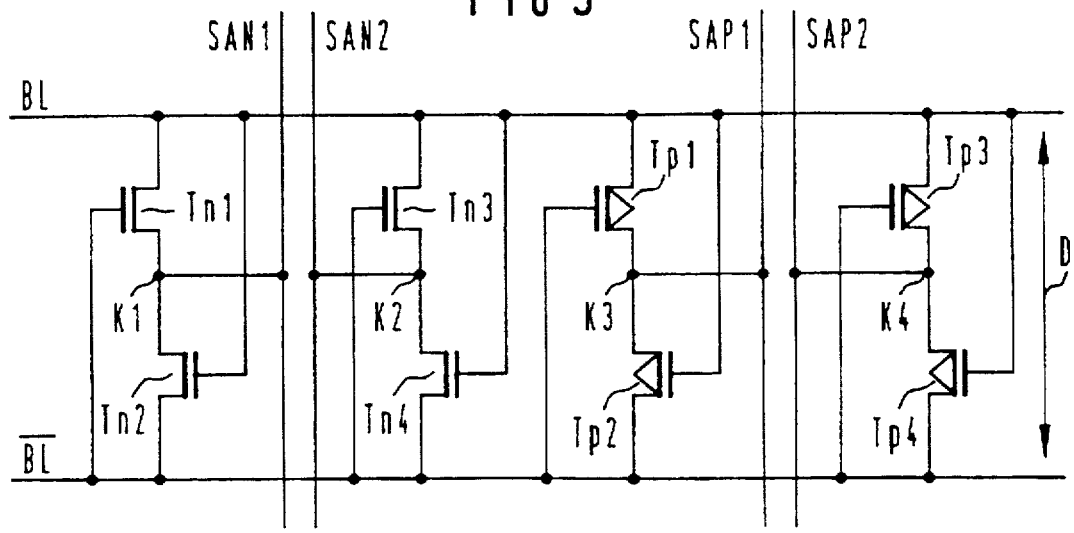
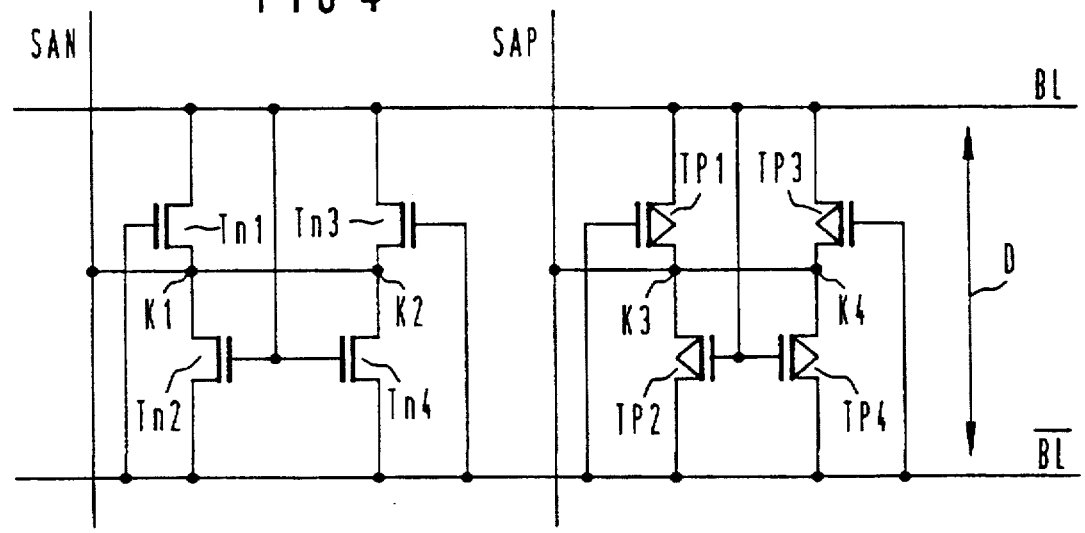

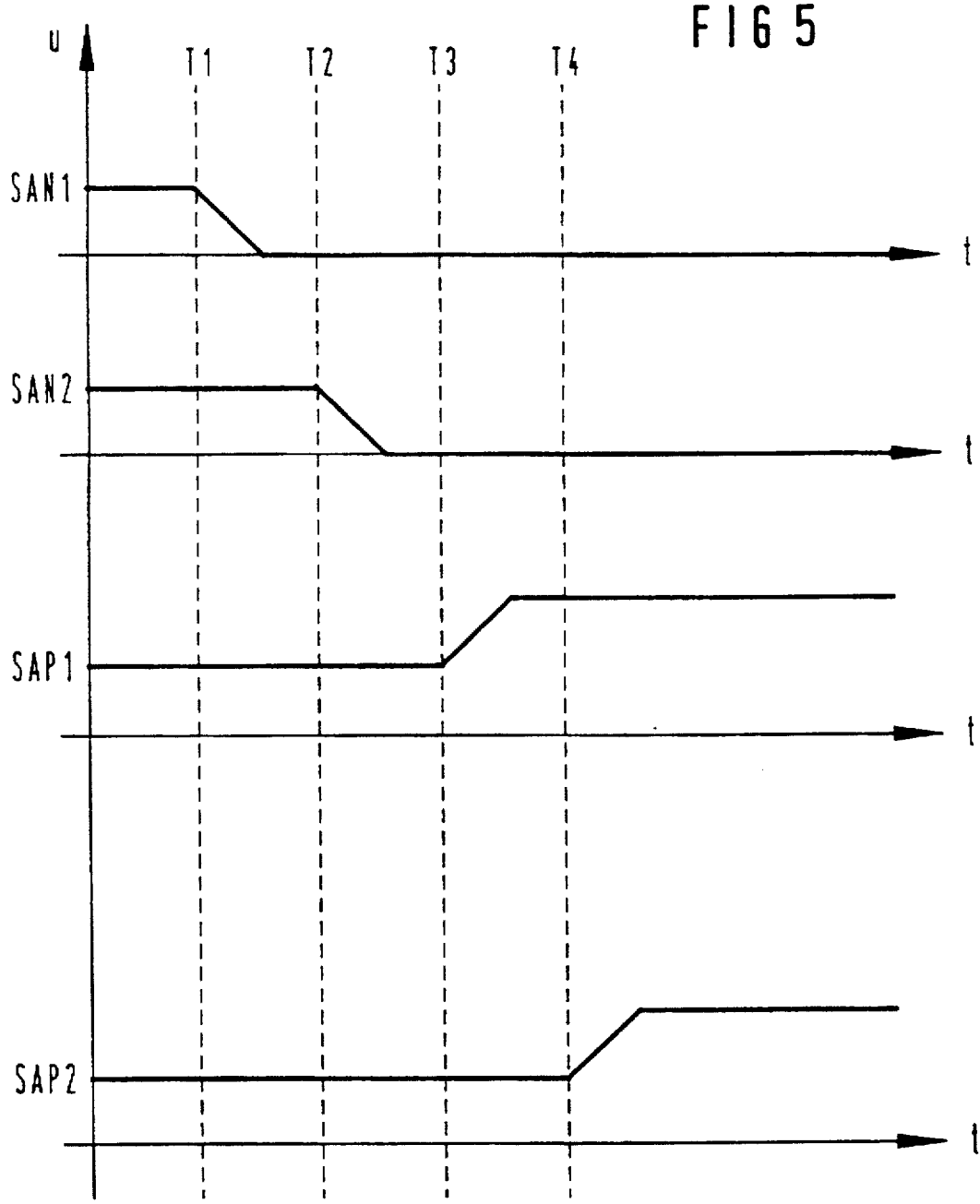

EVALUATION AND AMPLIFIER CIRCUIT

BACKGROUND OF THE INVENTION

1. Field of the Invention

The invention relates to an evaluation and amplifier circuit having a keyed flipflop, having at least two first transistors of a given channel the connected in series to each other, and disposed between two signal lines, in which the gates of the first transistors are connected with one of the two signal lines, and of which the first transistors form a first node common to the first transistors, which can receive a first control signal.

Such evaluation and amplifier circuits are used in particular as ("external" or "internal") sense amplifiers in RAMs, Random Access Memories, especially in DRAMs, Dynamic Random Access Memories. Evaluation and amplifier circuits of this class are generally known among experts, at least in the field of DRAMs. FIG. 1 shows such a circuit. In general, here, it is irrelevant whether both transistors of the evaluation and amplifier circuit are of the p-channel or n-channel type.

When the known evaluation and amplifier circuits are used (for example, with n-channel transistors) as sense amplifiers of RAMs, in particular, where it is known that a plurality of these evaluation and amplifier circuits of the same class are used per RAM, a problem arises that, although such evaluation and amplifier circuits are used as sense amplifiers, namely—from a spatial point of view—when the amplifiers are disposed in proximity to a line for a first supply potential VSS (usually ground). In that case they evaluate and amplify rapidly when evaluating and amplifying a signal corresponding to what is known as "physical 1" when such evaluation and amplifier circuits are used as sense amplifiers (viewed again from a spatial point of view). However, when they are disposed far away from such a line for the first supply voltage VSS they evaluate and amplify relatively slowly when evaluating and amplifying what is known as "physical 0" (closer with respect to potential to the value of the first supply potential VSS than "physical 1"). The same applies for circuits of the same class having p-channel transistors. It is known that the slowest evaluation and amplifier circuits (among other things) determine the operating speed of the entire circuitry in which they are contained, i.e. those of the RAM in question in our example.

SUMMARY OF THE INVENTION

It is accordingly an object of the invention to provide an evaluation and amplifier circuit which overcomes the hereinafore-mentioned disadvantages of the heretofore-known devices of this general type and which has a higher operating speed.

This objective is attained with respect to an evaluation and amplifier circuit of the same class through the characteristics that the evaluation and amplifier circuit has, in parallel to the first transistors and series circuit of at least two second transistors of the same channel type as the first transistors, of which the gates are connected alternately with one of the two signal lines.

With the foregoing and other objects in view there is provided, in accordance with the invention, an evaluation and amplifier circuit of the type of a keyed flipflop, comprising at least two first transistors of a given channel type connected in series to each other disposed between first and second signal lines, including a connection from the gates of the first transistors to a respective one of the second and first signal lines, wherein the first two transistors respectively form a first node common to the first two transistors for receiving a first control signal; a series circuit having at least two second transistors of the same channel type as the first transistors being connected in parallel to the first transistors; the gates of the first transistors further being connected with a respective one of the second and first signal lines; the second transistors forming a second node common to said second transistors for receiving a second control signal, and wherein a differential signal appearing on the signal lines is evaluated and amplified by the second transistors after the first transistors have received the differential signal.

According to a further feature of the evaluation and amplifier circuit in accordance with the invention, the second transistors receive an edge of the second control signal operative for triggering the evaluation and amplification after a delay in relation to a corresponding edge of the first control signal.

According to an additional feature of the evaluation and amplifier circuit, the edge of the second control signal triggering the evaluation and amplification has a lower rate of rise than a corresponding edge of the first control signal thereby causing a later start of the evaluation and amplification by the second transistors.

According to a still further feature, the evaluation and amplifier circuit, the first control signal and the second control signal operate as a single, common control signal and wherein the second transistors have threshold voltages being different from that of the first transistors.

According to still an additional feature of the evaluation and amplifier circuit, the first transistors and the second transistors have channels of different lengths.

According to again another feature, the evaluation and amplifier circuit has at least two third transistors of channel type opposite that of the first transistors, and at least two fourth transistors of the opposite channel type, wherein the third and fourth transistors are disposed in parallel to the first and the second transistors between the signal lines forming a third and a fourth node, which are operative for receiving a third and a fourth control signal, and wherein the differential signal is not evaluated and amplified by the fourth transistors until the third transistors have started a corresponding evaluation and amplification.

According to again an additional feature of the evaluation and amplifier circuit, the edge of the fourth control signal triggering the evaluation and amplification is delayed in relation to a corresponding edge of the third control signal thereby causing a later start of the evaluation and amplification by the fourth transistors.

According to a further feature of the evaluation and amplifier circuit, the edge of the fourth control signal triggering the evaluation and amplification has a lower rate of rise than a corresponding edge of the third control signal thereby causing a later start of the evaluation and amplification by the fourth transistors.

According to an additional feature of the evaluation and amplifier circuit, the third control signal and the fourth control signal are combined into a single, common control signal, wherein the fourth transistors have threshold voltages that are different from the threshold voltages of the fourth transistors.

According to a concomitant feature of the evaluation and amplifier circuit, the third transistors and the fourth transistors have channels of different lengths.

Other features which are considered as characteristic for the invention are set forth in the appended claims.

3

Although the invention is illustrated and described herein as embodied in an evaluation and amplifier circuit, it is nevertheless not intended to be limited to the details shown, since various modifications and structural changes may be made therein without departing from the Spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 shows a first as well as a third embodiment of the invention;

FIG. 4 shows a second as well as a fourth embodiment of the invention; and

FIG. 5 shows a timing diagram.

DESCRIPTION OF THE PREFERRED EMBODIMENTS

Figure 1:
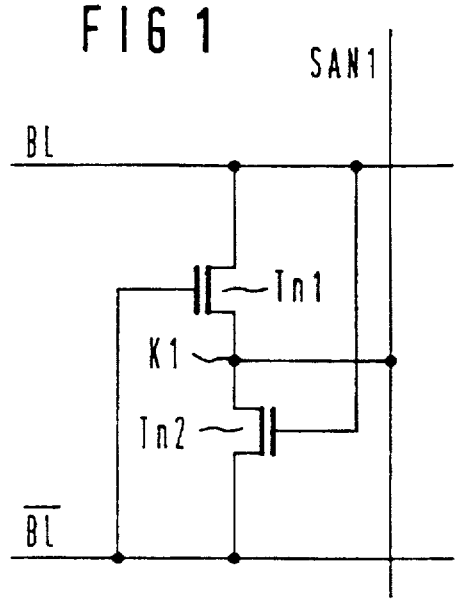
FIGS. 1 and 2 show evaluation and amplifier circuits of the known art.

Referring now to the figures of the drawings in detail and first, particularly, to FIG. 3 thereof, there is seen a first embodiment of the invention. The third transistors Tp1 to Tp4 (also shown in FIG. 3) should be disregarded at this time. The relevant section of FIG. 3 shows first transistors Tn1 and Tn2 of the n-channel type, already known from the prior art, which are disposed in series with each other between two signal lines BL, BL (known in RAMs, in general, as "bit line halves"). Their gates are connected respectively to the two signal lines BL, BL, i.e. the gate of one first transistor Tn1 is connected to the other signal line BL, while the gate of the other first transistor Tn2 is connected to the signal line BL. The connection between the two first transistors Tn1, Tn2 forms one node K1, which can receive the first control signal SAN1 (see FIG. 5 for the time lapse: the evaluation and amplification process is started by the trailing edge of the first control signal SAN1). In accordance with the invention, two second transistors Tn3, Tn4 of the same channel type as the two first transistors Tn1, Tn2 are disposed parallel to the first transistors Tn1, Tn2 between the two signal lines BL, BL. Their gates are also connected respectively to the two signal lines BL, BL according to the gates of the two first transistors Tn1, Tn2. A second node K2, which can receive a second control signal SAN2, is located between the two second transistors Tn3, Tn4.

In this embodiment, in accordance with the invention, the second control signal SAN2 occurs later in time than the first control signal SAN1 (cf. FIG. 5), such that the first two transistors Tn1, Tn2 have already started the evaluation and amplification of a differential signal D occurring on both signal lines BL, BL (in the case of RAMs, for example, caused by reading from a memory cell connected to the first [or both] signal line BL [or signal lines, BL, BL]) on the basis of the trailing edge of the first control signal SAN1, by the time the second transistors Tn3, Tn4 (corresponding to a trailing edge of the second control signal SAN2) starts evaluating and amplifying the differential signal D, which at this stage is already partially evaluated and amplified.

Of course it is also possible to use p-channel transistors as the first or second transistors instead of the n-channel

4 transistors Tn1 to Tn4 shown in FIG. 3. In this case, in this first exemplary embodiment shown in FIG. 3 we should instead look at the p-channel transistors Tp1 to Tp4 with nodes K3, K4 and the control signals SAP1, SAP2, which—unlike the control signals SAN1, SAN2—trigger the evaluation and amplification with a leading edge.

FIG. 4 shows a second (as well as a fourth) exemplary embodiment of the present invention. Here too, with respect to the second exemplary embodiment, as with the first exemplary embodiment in FIG. 3, the transistors Tp1 to Tp4 and their control signal SAP should be disregarded at this time. With respect to circuit technology alone, this exemplary embodiment differs from the first exemplary embodiment through the fact that the two control signals SAN1 and SAN2 shown in FIG. 3 are replaced by a single control signal SAN, which is connected to both nodes K1 and K2. In order for the two second transistors Tn3, Tn4 to commence the evaluation and amplification of the differential signal D only after the two first transistors Tn1, Tn2 have already started their evaluation and amplification—which is in keeping with the basic idea of the invention—the second transistors Tn3, Tn4 in this embodiment have threshold voltages $U_{Tn3}$, $U_{Tn4}$ that differ correspondingly from the threshold voltages $U_{Tn1}$, $U_{Tn2}$ of the first two transistors Tn1, Tn2. This ensures that the evaluation of the differential signal D by the first transistors Tn1, Tn2 starts at an earlier point in time than that by the second transistors Tn3, Tn4. Here, too, it is of course possible—as with the first exemplary embodiment—for the first and second transistors to be of the p-channel type, i.e. in FIG. 4, for the transistors Tp1 to Tp4 and the control signal SAP, instead of the transistors Tn1 to Tn4 and the control signal SAN, to form the evaluation and amplifier circuit in accordance with the second exemplary embodiment.

Figure 2:
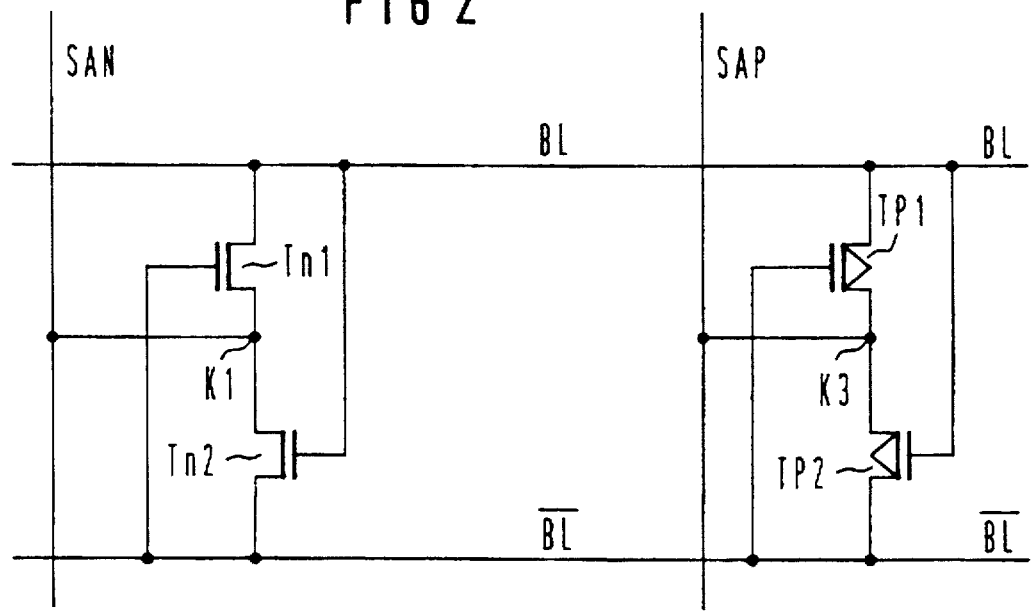

The entire FIG. 3, i.e. all transistors Tn1 to Tn4 and Tp1 to Tp4 and the control signals SAN1, SAN2, SAP1, SAP2, forms the third embodiment of the present invention. It is generally known among experts, e.g. in the field of DRAMs, that the first transistors Tn1, Tn2 form an evaluation and amplifier circuit of the same class, but it is also known that transistors of the opposite channel type than that of the first transistors Tn1, Tn2, i.e. third transistors Tp1, Tp2, form a further component of this evaluation and amplifier circuit. This is shown in FIG. 2. These third transistors Tp1, Tp2 also have a common node, the third node K3, which can receive a third control signal SAP1. A leading edge of this third control signal SAP1 triggers during operation—as is known—the evaluation and amplification process for the differential signal D by the third transistors Tp1, Tp2. The third embodiment of the present invention then includes (cf. the entire FIG. 3) at least two fourth transistors Tp3, Tp4, in addition to the arrangement of the first and second transistors Tn1 to Tn4—already described in reference to the first embodiment—and the arrangement of the third transistors Tp1, Tp2, of which fourth transistors Tp3, Tp4 are of the same channel type as the third transistors Tp1, Tp2 and which, in series to each other, are also switched between the two data lines BL, BL. The connection thereby formed between the two fourth transistors Tp3, Tp4 forms a fourth node K4, which can receive a fourth control signal SAP2. In accordance with the invention (cf. FIG. 5), the edge of the fourth control signal SAP2 (which is of course a leading edge for transistors Tp3, Tp4 of the p-channel type) which triggers the evaluation and amplification of the differential signal D is delayed in time in relation to the corresponding edge of the third control signal SAP1. The evaluation and amplification of the data signal D by the fourth transistors Tp3, Tp4 therefore also occurs later in time than the evaluation and amplification of this data signal D by the third transistors Tp1, Tp2.

The entire FIG. 4 (i.e. with all transistors Tn1 to Tn4 and Tp1 to Tp4) shows a fourth embodiment of the invention. From the point of view of circuit technology alone, it differs from the third embodiment only through the fact that the first (SAN1) and the second control signal SAN2 are replaced by a common control signal SAN, and that the third (SAP1) and the fourth control signal SAP2 are replaced by another common control signal SAP. The threshold voltages of the first (Tn1, Tn2) and the second transistors Tn3, Tn4 differ from each other in accordance with the second exemplary embodiment. Moreover, however, the threshold voltages $U_{Tp1}$, $U_{Tp2}$ of the third transistors Tp1, Tp2 differ correspondingly from the relevant threshold voltages $U_{Tp3}$, $U_{Tp4}$ of the fourth transistors Tp3, Tp4. This ensures also for this embodiment that the start of the evaluation and amplification of the differential signal D by the second (Tn3, Tn4) and fourth transistors Tp3, Tp4 is correspondingly delayed in relation to the relevant start of evaluation and amplification by the first (Tn1, Tn2) and third transistors Tp1, Tp2.

FIG. 5 shows a timing diagram with respect to the present invention, which primarily shows the relationships for the third embodiment already described: The (trailing) edge of the second control signal SAN2 that triggers the evaluation and amplification occurs later in time than the corresponding edge of the first control signal SAN1. Similarly, the (leading) edge of the fourth control signal SAP2 that triggers the evaluation and amplification occurs later in time than the corresponding edge of the third control signal SAP1 (cf. the relevant points in time T2, T1 and T4, T3). The part of FIG. 5 that shows the control signals SAN1, SAN2, however, is also representative of the first embodiment.

The different point in time for the start of evaluation and amplification by the second (Tn3, Tn4) or fourth transistors Tp3, Tp4, in relation to the corresponding points in time for the first or third transistors (Tn1, Tn2; Tp1, Tp2), can of course be specified in a different way, e.g. by selecting correspondingly different channel lengths an/or materials and/or doping the materials used for the relevant transistors Tn1 to Tn4, Tp1 to Tp4 or through different edge rates of rise for the first and second or the third and fourth control signals SAN1, SAN2, SAP1, SAP2.

I claim:

1. An evaluation and amplifier circuit of the type of a keyed flipflop, comprising at least two first transistors of a given channel type connected in series to each other between a first and a second signal line, including a connection from the gates of the first transistors to a respective one of the second and first signal lines, wherein said first two transistors respectively form a first node common to said first two transistors for receiving a first control signal;

a series circuit having at least two second transistors of the same channel type as the first transistors and being connected in parallel to the first transistors; the gates of the second transistors being connected with a respective one of said second and first signal lines;

said second transistors forming a second node common to said second transistors for receiving a second control signal, and wherein a differential signal appearing on the signal lines is evaluated and amplified by the second transistors after the first transistors have evaluated and amplified the differential signal.

2. The evaluation and amplifier circuit according to claim 1, wherein said second transistors receive an edge of the second control signal operative for triggering the evaluation and amplification after a delay in relation to a corresponding edge of the first control signal.

3. The evaluation and amplifier circuit according to claim 2, wherein the edge of the second control signal triggering the evaluation and amplification has a lower rate of rise than a corresponding edge of the first control signal thereby causing a later start of the evaluation and amplification by the second transistors.

4. The evaluation and amplifier circuit according to claim 1, wherein said first control signal and said second control signal operate as a single, common control signal and wherein said second transistors have a threshold voltage being different from that of said first transistors.

5. The evaluation and amplifier circuit according to claim 1, wherein said first transistors and said second transistors have channels of different lengths.

6. The evaluation and amplifier circuit according to claim 1 having a series circuit of at least two third transistors of channel type opposite that of the first transistors, and another series circuit of at least two fourth transistors of the opposite channel type, wherein said series circuit of said third and fourth transistors are in parallel to said first and said second transistors between said signal lines and have a respective third and a fourth node, operative for receiving a respective third and a fourth control signal, and wherein the gates of the third transistors are connected to a respective one of the second and first signal lines, and the gates of the fourth transistors are connected to a respective one of the second and first signal lines, and the differential signal is not evaluated and amplified by the fourth transistors until the third transistors have started a corresponding evaluation and amplification.

7. The evaluation and amplifier circuit according to claim 6, wherein the edge of the fourth control signal triggering the evaluation and amplification is delayed in relation to a corresponding edge of the third control signal thereby causing a later start of the evaluation and amplification by the fourth transistors.

8. The evaluation and amplifier circuit according to claim 6, wherein the edge of the fourth control signal triggering the evaluation and amplification has a lower rate of rise than a corresponding edge of the third control signal thereby causing a later start of the evaluation and amplification by the fourth transistors.

9. The evaluation and amplifier circuit according to claim 6, wherein the third control signal and the fourth control signal are combined into a single, common control signal, and wherein the fourth transistors have threshold voltages that are different from the threshold voltages of the fourth transistors.

10. The evaluation and amplifier circuit according to claim 6, wherein said third transistors and said fourth transistors have channels of different lengths.

* * * * *